United States Patent
Hwang (10) Patent No.: US 10,423,565 B2
(45) Date of Patent: Sep. 24, 2019

(54) DATA TRANSMISSION SYSTEMS HAVING A PLURALITY OF TRANSMISSION LANES AND METHODS OF TESTING TRANSMISSION DATA IN THE DATA TRANSMISSION SYSTEMS

(71) Applicant: SK hynix Inc., Icheon-si, Gyeonggi-do (KR)

(72) Inventor: Minsoon Hwang, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 3 days.

(21) Appl. No.: 15/471,531

(22) Filed: Mar. 28, 2017

(65) Prior Publication Data

US 2018/0107625 A1   Apr. 19, 2018

(30) Foreign Application Priority Data

Oct. 13, 2016 (KR) .................. 10-2016-0132937

(51) Int. Cl.
- *G06F 13/42* (2006.01)
- *G06F 13/36* (2006.01)
- *G11C 19/28* (2006.01)
- *H03K 19/21* (2006.01)

(52) U.S. Cl.
CPC .......... *G06F 13/4282* (2013.01); *G06F 13/36* (2013.01); *G11C 19/28* (2013.01); *H03K 19/21* (2013.01)

(58) Field of Classification Search
CPC .......................... G06F 13/4282; G11C 19/28
See application file for complete search history.

(56) References Cited

U.S. PATENT DOCUMENTS

| | | | | |
|---|---|---|---|---|
| 4,799,040 A * | 1/1989 | Yanagi | .................... | G11C 19/00 341/101 |
| 5,576,980 A | 11/1996 | Whetsel | | |
| 2003/0149922 A1* | 8/2003 | Lai | ........................ | G01R 31/317 714/724 |
| 2009/0015449 A1* | 1/2009 | Ishii | ......................... | H03M 9/00 341/100 |
| 2012/0038399 A1* | 2/2012 | Mizuno | .................... | H03M 9/00 327/155 |
| 2013/0187799 A1* | 7/2013 | Chang | ...................... | H03M 9/00 341/101 |
| 2018/0302076 A1* | 10/2018 | Fujita | ........................ | H03K 5/00 |

* cited by examiner

*Primary Examiner* — Zachary K Huson (74) *Attorney, Agent, or Firm* — William Park & Associates Ltd.

(57) ABSTRACT

A data transmission system is provided. The data transmission system includes a plurality of data transmitters that respectively constitute a plurality of transmission lanes. Each of the plurality of data transmitters includes a serializer and an output signal storage circuit. The serializer coverts parallel input data into serial output data and outputs the serial output data. The output signal storage circuit stores the serial output data output from the serializer.

12 Claims, 7 Drawing Sheets

DATA TRANSMISSION SYSTEMS HAVING A PLURALITY OF TRANSMISSION LANES AND METHODS OF TESTING TRANSMISSION DATA IN THE DATA TRANSMISSION SYSTEMS

CROSS-REFERENCE TO RELATED APPLICATIONS

The present application claims priority under 35 U.S.C. 119(a) to Korean Application number 10-2016-0132937 filed on Oct. 13, 2016, which is herein incorporated by references in its entirety.

BACKGROUND

1. Technical Field

Various embodiments of the present disclosure relate to data transmission systems, and, more particularly, to data transmission systems having a plurality of transmission lanes and methods of testing data transmitted in the data transmission systems.

2. Related Art

In mobile systems and computer systems, a parallel bus scheme is frequently used in a data transmission interface to transfer multiple bits simultaneously. In a condition where central processing units (CPUs), memory devices, and peripheral devices in the mobile systems and the computer systems transmit a large amount of data, however, there may be limitations in transmitting the data using general parallel bus schemes. In addition, the parallel bus scheme requires many interconnection lines to be arranged in a small space, and these difficulties may make parallel communication less practical. In contrast, some serial interface schemes such as a point-to-point type serial interface scheme offer several benefits over the parallel bus scheme in terms of transmission speed and interconnect density. The serial interface scheme is designed to support not only a single transmission lane, but also a plurality of transmission lanes. Thus, the serial interface scheme may improve a data transmission speed of the mobile systems or the computer systems.

If a plurality of data transmission lanes are employed in the mobile systems or the computer systems, in some cases, the number of transmitters may be equal to the number of receivers, but in other cases, the number of transmitters may be different from the number of receivers. If the number of the transmitters is equal to the number of the receivers, test operations associated with data transmitted through the plurality of the transmission lanes may be performed in the receivers. However, if the number of the transmitters is different from the number of the receivers, it may be difficult to simultaneously perform the test operations associated with the data transmitted through the plurality of the transmission lanes. Thus, it may be necessary to match the transmitters with the receivers to individually test the data transmitted through the plurality of the transmission lanes. However, in such a case, transmission timing distortions between the transmission lanes may occur and it may be difficult to detect the transmission timing distortions.

SUMMARY

According to an embodiment, a data transmission system may include a plurality of data transmitters that respectively constitute a plurality of transmission lanes. Each of the plurality of data transmitters may include a serializer and an output signal storage circuit. The serializer may covert parallel input data into serial output data and output the serial output data. The output signal storage circuit may store the serial output data output from the serializer.

According to an embodiment, there is provided a method of testing a data transmission system transmitting a plurality of data through a plurality of data transmitters included in a plurality of transmission lanes. The method may include serializing parallel input data inputted to the plurality of data transmitters to generate serial output data, sequentially storing the serial output data in the plurality of data transmitters, converting the stored serial output data into parallel output data to output the parallel output data from the plurality of data transmitters, and comparing the parallel output data output from the plurality of data transmitters to determine whether data transmission distortion occurs between the plurality of transmission lanes.

BRIEF DESCRIPTION OF THE DRAWINGS

Various embodiments of the present disclosure will become more apparent in view of the attached drawings and accompanying detailed description, in which.

DETAILED DESCRIPTION

In the following description of the embodiments, it will be understood that the terms "first" and "second" are intended to identify an element, but not used to define only the element itself or to mean a particular sequence. In addition, when an element is referred to as being located "on," "over," "above," "under" or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
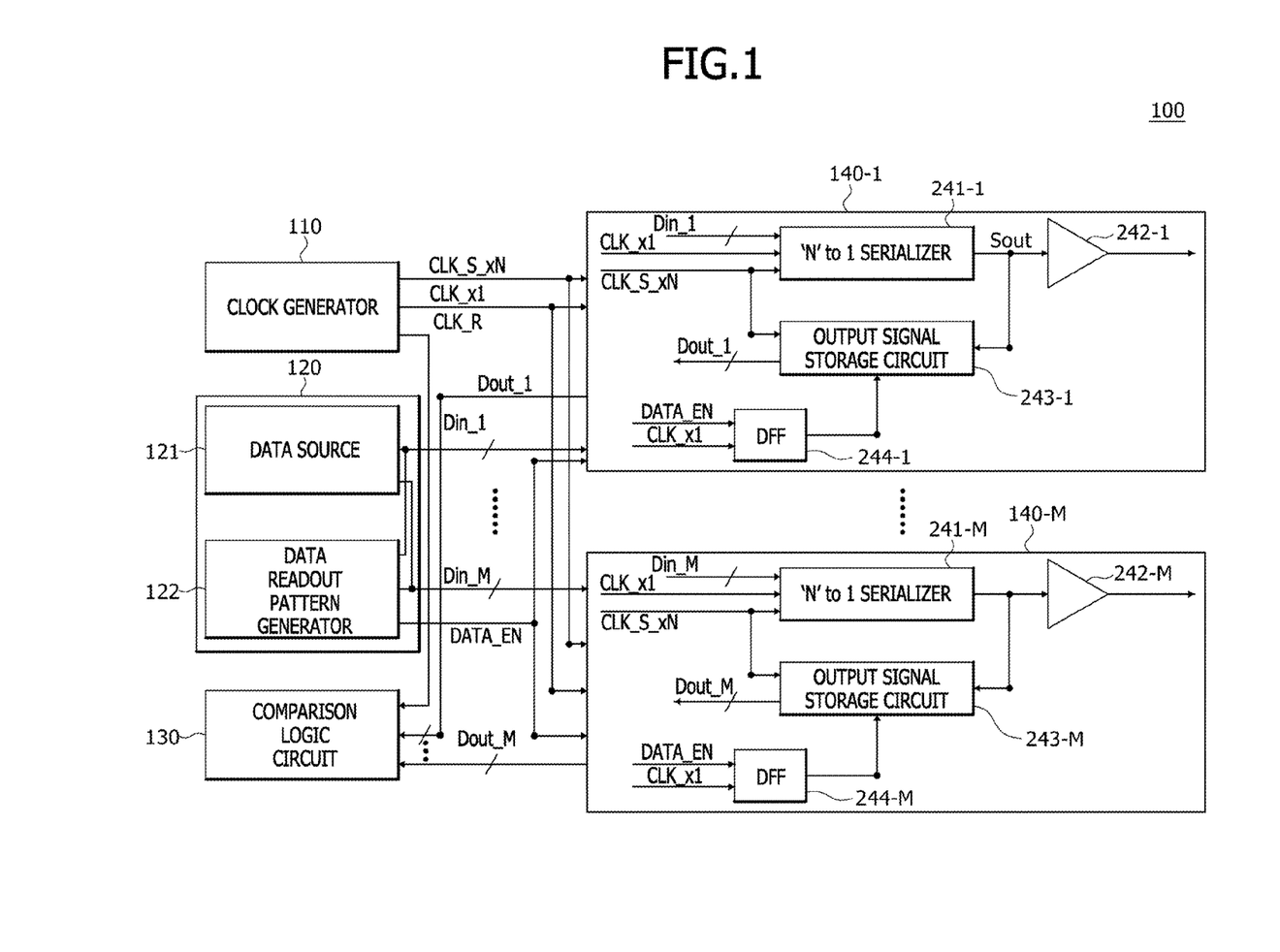
FIG. 1 is a diagram illustrating an example of a data transmission system according to an embodiment of the present disclosure.

Referring to FIG. 1, a data transmission system 100 may include a clock generator 110, a data generator 120, a comparison circuit 130, and a plurality of data transmitters 140-1, ..., and 140-M. The data transmission system 100 may be used to transmit "M" number of N-bit data elements to a receiver through "M" number of data transmitters 140-1, ..., and 140-M (i.e., first to $M^{th}$ data transmitters 140-1, ..., and 140-M). Here, the N-bit data elements may be defined as a unit of data consisting of N bits. While the "M" number of data elements are being transmitted to the receiver, the data transmission system 100 may detect occurrence of data distortion between the "M" number of data transmitters 140-1, ..., and 140-M using a test read clock signal which is different from a clock signal input to serializers of the data transmitters 140-1, ..., and 140-M. Here, the data element may be defined as a unit of data.

The clock generator 110 may generate a synchronization clock signal CLK_x1, a serializer driving clock signal CLK_S_xN, and a test read clock signal CLK_R. The synchronization clock signal CLK_x1 and the serializer driving clock signal CLK_S_xN may be applied to each of the data transmitters 140-1, ..., and 140-M. The test read clock signal CLK_R may be applied to the comparison circuit 130. The synchronization clock signal CLK_x1 may be used in synchronization of a data enablement signal DATA_EN which is generated from the data generator 120. In some embodiments, a cycle time of the synchronization clock signal CLK_x1 may be set to be half the data enablement signal DATA_EN. The serializer driving clock signal CLK_S_xN may be used in driving the serializers of the data transmitters 140-1, ..., and 140-M. Thus, serial output data signals Sout of the serializers may be output in synchronization with the serializer driving clock signal CLK_S_xN. The comparison circuit 130 may detect the data transmission distortion in the data transmitters 140-1, ..., and 140-M using the test read clock signal CLK_R. In some embodiments, the test read clock signal CLK_R may be provided by users.

Figure 2:
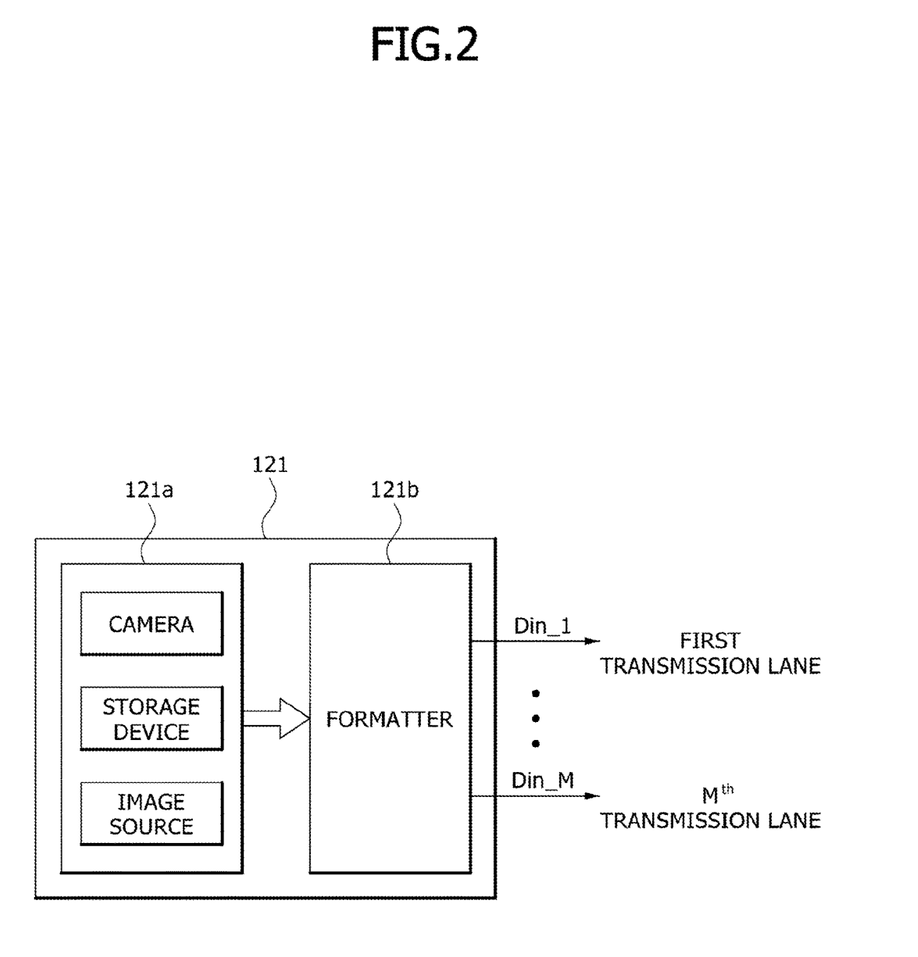
FIG. 2 is a diagram illustrating an example of a data source included in the data transmission system of FIG. 1.

The data generator 120 may include a data source 121 and a data readout pattern generator 122. The data source 121 may generate "M" number of N-bit data elements Din_1, ..., and Din_M (i.e., first to $M^{th}$ N-bit data Din_1, ..., and Din_M) which are transmitted by the data transmitters 140-1, ..., and 140-M during a normal operation. The "M" number of the N-bit data elements Din_1, ..., and Din_M may correspond to main data to be transmitted to the receiver. The "M" number of the N-bit data elements Din_1, ..., and Din_M may be input to the "M" number of the data transmitters 140-1, ..., and 140-M included in "M" number of transmission lanes (i.e., first to $M^{th}$ transmission lanes), respectively. In some embodiments, the data source 121 may include an original image/data generator 121a and a formatter 121b, as illustrated in FIG. 2. The original image/data generator 121a may include at least one of a camera, a storage device, and an image source. The camera or the storage device may transmit images to the formatter 121b. The storage device such as a solid state drive SSD or a hard disk drive HDD may transmit data to the formatter 121b. The formatter 121b may identify a format of the transmitted data or the transmitted images to generate the "M" number of the N-bit data elements Din_1, ..., and Din_M. The "M" number of the N-bit data Din_1, ..., and Din_M may have the same value or different values.

Figure 3:
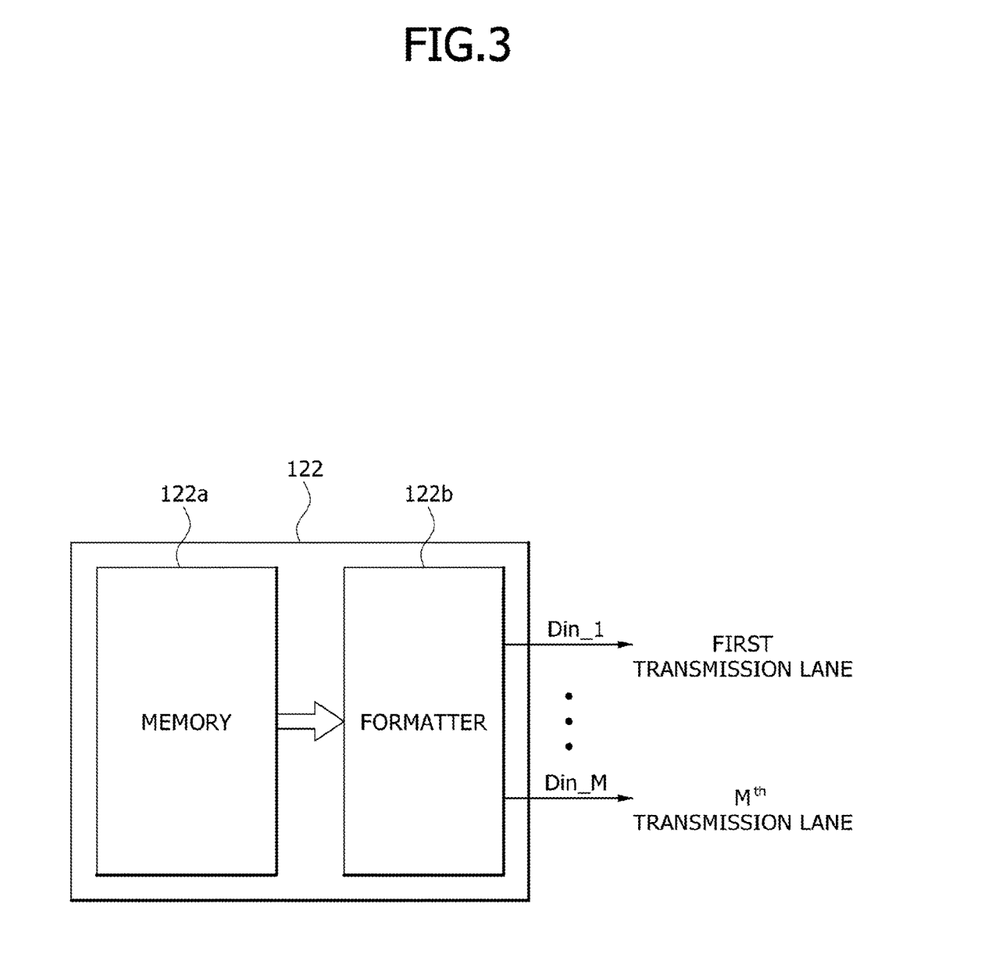
FIG. 3 is a diagram illustrating an example of a data readout pattern generator included in the data transmission system of FIG. 1.

For the purpose of testing the data transmission system, the data readout pattern generator 122 may generate "M" number of the N-bit data elements Din_1, ..., and Din_M and the data enablement signal DATA_EN. The "M" number of the N-bit data elements Din_1, ..., and Din_M may be transmitted to the "M" number of the data transmitters 140-1, ..., and 140-M included in the "M" number of the transmission lanes, respectively. The data enablement signal DATA_EN may be input to all of the "M" number of the data transmitters 140-1, ..., and 140-M. In some embodiments, the data readout pattern generator 122 may include a memory 122a and a formatter 122b, as illustrated in FIG. 3. The memory 122a may store various types of test image/data, for example, color bar images, random pattern data and/or fixed pattern data. The memory 122a may be realized using a static random access memory (SRAM), a register or a read only memory (ROM). The image/data stored in the memory 122a may be transmitted to the formatter 122b. The formatter 122b may identify a format of the transmitted data or the transmitted images to generate the "M" number of the N-bit data Din_1, ..., and Din_M. Here, the "M" number of the N-bit data Din_1, ..., and Din_M generated from the data readout pattern generator 122 may correspond to data for testing or detecting transmission distortion between the "M" number of the transmission lanes and may have the same value.

The comparison circuit 130 may receive "M" number of output data elements Dout_1, ..., and Dout_M (i.e., first to $M^{th}$ output data elements Dout_1, ..., and Dout_M) which are output from the "M" number of the data transmitters 140-1, ..., and 140-M and may compare the "M" number of the output data elements Dout_1, ..., and Dout_M with each other to determine whether data transmission distortion between the "M" number of the transmission lanes occurs. For example, if all of the "M" number of the output data elements Dout_1, ..., and Dout_M are identical to each other, the comparison circuit 130 may generate a first output signal which means that no data transmission distortion occurs between the "M" number of the transmission lanes. In contrast, if at least one of the "M" number of the output data elements Dout_1, ..., and Dout_M are different from the other output data elements, the comparison circuit 130 may generate a second output signal which means that data transmission distortion occurs between the "M" number of the transmission lanes.

Figure 4:
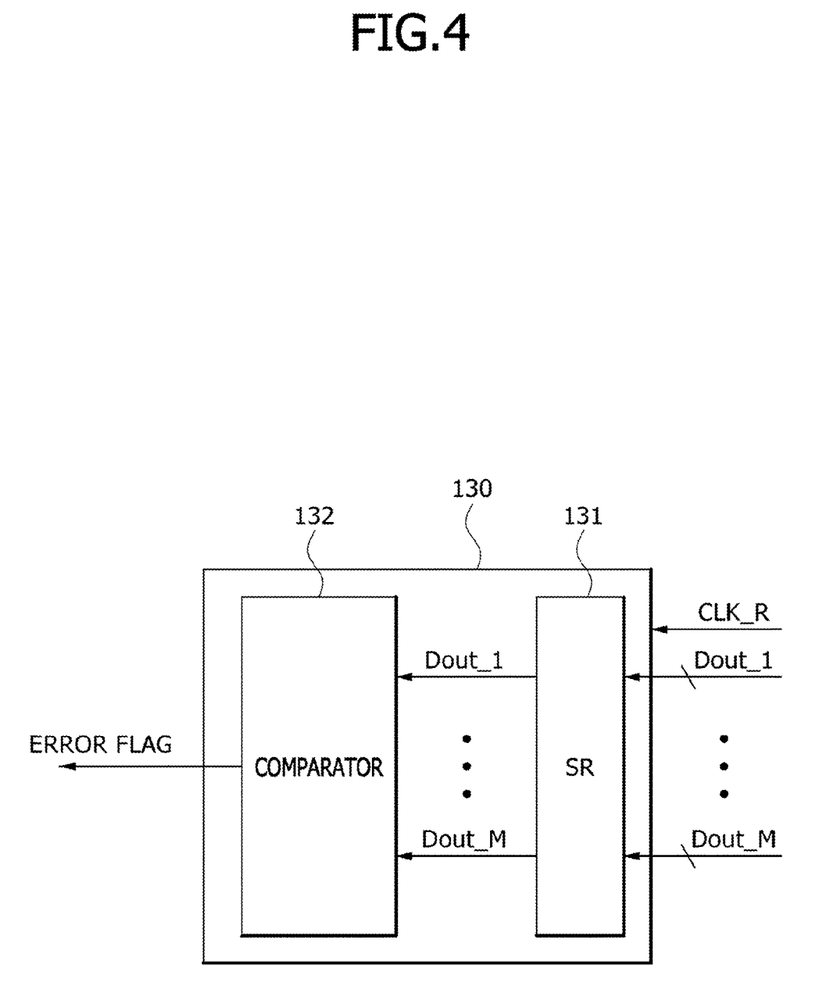
FIG. 4 is a diagram illustrating an example of a comparison logic circuit included in the data transmission system of FIG. 1.

In some embodiments, the comparison circuit 130 may include a shift register (SR) 131 and a comparator 132. The shift register (SR) 131 may receive and store the "M" number of the output data elements Dout_1, ..., and Dout_M which are output from the "M" number of the data transmitters 140-1, ..., and 140-M. The "M" number of the output data elements Dout_1, ..., and Dout_M may be shifted in parallel in the shift register (SR) 131, and may be output from the shift register (SR) 131. The "M" number of the output data Dout_1, ..., and Dout_M output from the shift register (SR) 131 may be input to the comparator 132. The comparator 132 may compare the "M" number of the output data elements Dout_1, ..., and Dout_M to output an error flag. At least one of the shift register (SR) 131 and the comparator 132 may operate in synchronization with the data read clock signal CLK_R.

Figure 5:
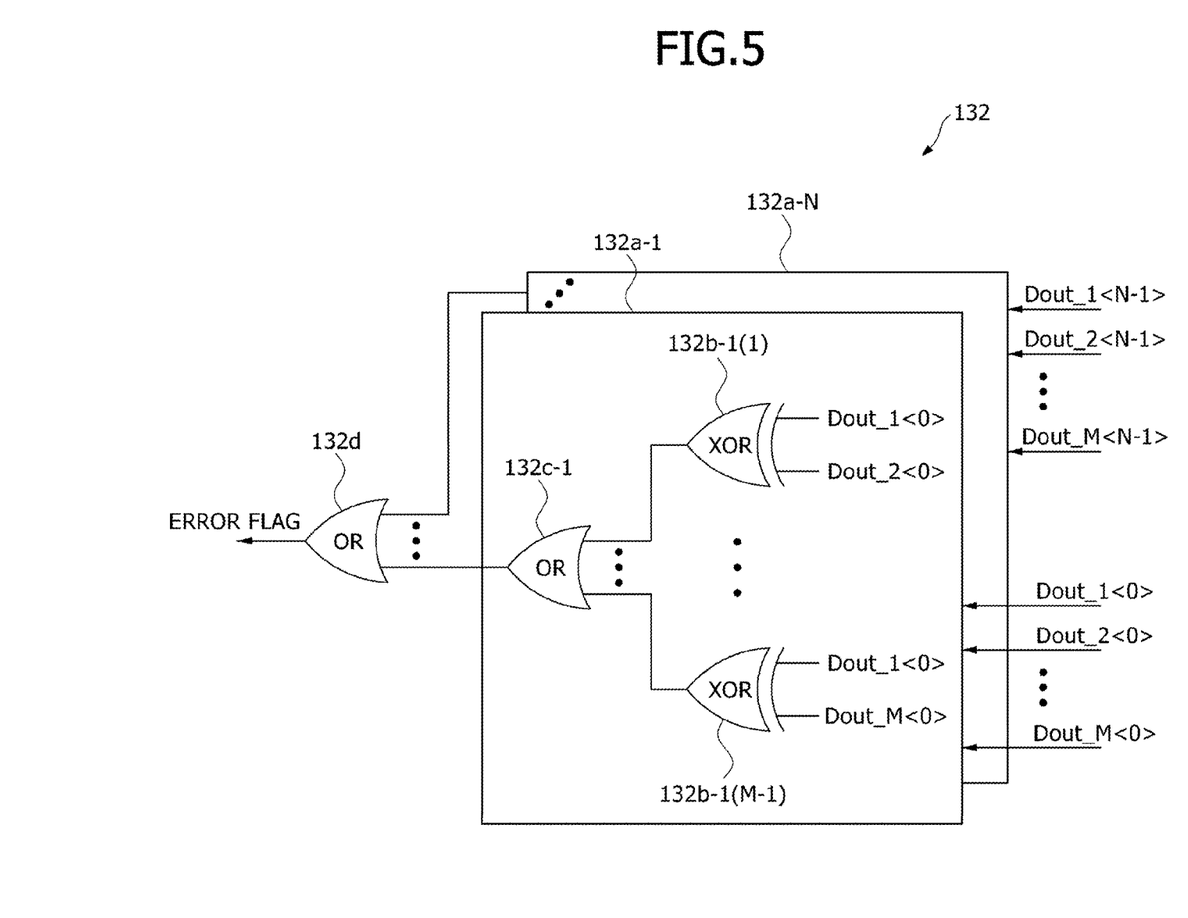
FIG. 5 is a diagram illustrating an example of a comparator included in the comparison logic circuit of FIG. 4.

In some embodiments, the comparator 132 may include "N" number of comparison logic circuits 132a-1, ..., and 132a-N (i.e., first to $N^{th}$ comparison logic circuits 132a-1, ..., and 132a-N) and an OR gate 132d, as illustrated in FIG. 5. The first to $N^{th}$ comparison logic circuits 132a-1, ..., and 132a-N may have the same configuration, except that the input data of the first to $N^{th}$ comparison logic circuits 132a-1, ..., and 132a-N may be different. For example, "M" number of first bits of the output data elements Dout_1<0>, Dout_2<0>, ..., and Dout_M<0>, among the "M" number of the output data elements Dout_1, Dout_2, ..., and Dout_M, may be input to the first comparison logic circuit 132a-1. Similarly, "M" number of $N^{th}$ bits of the output data elements Dout_1<N−1>, Dout_2<N−1>, ..., and Dout_M<N−1>, among the "M" number of the output data elements Dout_1, Dout_2, ..., and Dout_M, may be input to the $N^{th}$ comparison logic circuit 132a-N.

The first comparison logic circuit 132a-1 may include "(M−1)" number of exclusive OR gates 132b-1(1), ..., and 132b-1(M−1) (i.e., first to $(M-1)^{th}$ exclusive OR gates 132b-1(1), ..., and 132b-1(M−1)) and an OR gate 132c-1. The first bit of the first output data Dout_1<0> transmitted through the first transmission lane may be input to all of the first to $(M-1)^{th}$ exclusive OR gates 132b-1(1), ..., and 132b-1(M−1). The first bit of the second output data Dout_2<0> transmitted through the second transmission lane may be input to the first exclusive OR gates 132b-1(1). Thus, the first exclusive OR gate 132b-1(1) may output a low level signal (e.g., a logic-low signal) if the first bit data Dout_1<0> of the first output data Dout_1 transmitted through the first transmission lane is the same as the first bit data Dout_2<0> of the second output data Dout_2 transmitted through the second transmission lane, and may output a high level signal (e.g., a logic-high signal) if the first bit of the first output data Dout_1<0> transmitted through the first transmission lane is different from the first bit of the second output data Dout_2<0> transmitted through the second transmission lane. Similarly, the first bit of $M^{th}$ output data Dout_M<0> transmitted through the $M^{th}$ transmission lane may be input to the $(M-1)^{th}$ exclusive OR gates 132b-1(M−1). Thus, the $(M-1)^{th}$ exclusive OR gate 132b-1(M−1) may output a low level signal if the first bit of the first output data Dout_1<0> transmitted through the first transmission lane is the same as the first bit of the $M^{th}$ output data Dout_M<0> transmitted through the $M^{th}$ transmission lane, and may output a high level signal if the first bit of the first output data Dout_1<0> transmitted through the first transmission lane is different from the first bit of the $M^{th}$ output data Dout_M<0> transmitted through the $M^{th}$ transmission lane.

As described above, the first to $(M-1)^{th}$ exclusive OR gates 132b-1(1), ..., and 132b-1(M−1) may execute exclusive OR operations on the first bit of the first data Dout_1<0> and the first bits of the second to $M^{th}$ output data Dout_2<0> to Dout_M<0>, respectively. Output signals of the first to $(M-1)^{th}$ exclusive OR gates 132b-1(1), ..., and 132b-1(M−1) may be input to the OR gate 132c-1. If the first bit of the first output data Dout_1<0> transmitted through the first transmission lane is the same as the first bit of the second to $M^{th}$ output data Dout_2<0>~Dout_M<0> transmitted through the second to $M^{th}$ transmission lanes, respectively, all of input signals of the OR gate 132c-1 may be low level signals. In such a case, the OR gate 132c-1 may output a low level signal. In contrast, if the first bit of the first output data Dout_1<0> transmitted through the first transmission lane is different from at least one of the first bits of the second to $M^{th}$ output data Dout_2<0> to Dout_M<0> transmitted through the second to $M^{th}$ transmission lanes, at least one high level signal may be input to the OR gate 132c-1. In such a case, the OR gate 132c-1 may output a high level signal.

Each of the second to $N^{th}$ comparison logic circuits 132a-2, ..., and 132a-N may execute the same logical operations as the first comparison logic circuit 132a-1 described above. That is, in the case of the $N^{th}$ comparison logic circuit 132a-N, if the $N^{th}$ bit of the first output data Dout_1<N−1> transmitted through the first transmission lane is the same as the $N^{th}$ bit of the second to $M^{th}$ output data Dout_2<N−1> to Dout_M<N−1> transmitted through the second to $M^{th}$ transmission lanes, all of input signals of the OR gate 132c-1 may be low level signals. In such a case, the OR gate 132c-1 may output a low level signal. In contrast, if the $N^{th}$ bit of the first output data Dout_1<N−1> transmitted through the first transmission lane is different from at least one of the $N^{th}$ bits of the second to $M^{th}$ output data Dout_2<N−1> to Dout_M<N−1> transmitted through the second to $M^{th}$ transmission lanes, at least one high level signal may be input to the OR gate 132c-1. In such a case, the OR gate 132c-1 may output a high level signal.

Output signals of the OR gates 132c-1 included in the first to $N^{th}$ comparison logic circuits 132a-1, ..., and 132a-N may be input to the OR gate 132d. If all of the output signals of the OR gates 132c-1 are low level signals, the OR gate 132d may output a low level signal as an error flag signal. That is, if the first to $M^{th}$ output data Dout_1 to Dout_M respectively transmitted through the first to $M^{th}$ transmission lanes are identical to each other, the OR gate 132d may output the first output signal corresponding to a low level signal as the error flag signal. The first output signal of the OR gate 132d means that no data transmission distortion has occurred between the first to $M^{th}$ transmission lanes. In contrast, if at least one high level signal is input to the OR gate 132d, the OR gate 132d may output a high level signal as the error flag signal. That is, if at least one of the first to $M^{th}$ output data element Dout_1 to Dout_M respectively transmitted through the first to $M^{th}$ transmission lanes are different from the other output data elements, the OR gate 132d may output the second output signal corresponding to a high level signal as the error flag signal. The second output signal of the OR gate 132d means that data transmission distortion has occurred between the first to $M^{th}$ transmission lanes.

The first to $M^{th}$ data transmitters 140-1, ..., and 140-M may have the same configuration. The first data transmitter 140-1 may include an N-to-1 serializer 241-1, a buffer 242-1, an output signal storage circuit 243-1, and a D-flip flop (DFF) 244-1. Similarly, the $M^{th}$ data transmitter 140-M may include an N-to-1 serializer 241-M, a buffer 242-M, an output signal storage circuit 243-M, and a D-flip flop (DFF) 244-M. Hereinafter, configurations and operations of the N-to-1 serializer 241-1, the buffer 242-1, the output signal storage circuit 243-1, and the D-flip flop (DFF) 244-1 constituting the first data transmitters 140-1 will be described in detail.

The N-to-1 serializer 241-1 may operate in synchronization with the synchronization clock signal CLK_x1 and the serializer driving clock signal CLK_S_xN output from the clock generator 110. The N-to-1 serializer 241-1 may convert the first N-bit data Din_1, which is output in parallel from the data source 121, into the serial output data signal Sout, and may output the serial output data signal Sout. In order to covert the first N-bit data Din_1 into the serial output data signal Sout, the N-to-1 serializer 241-1 may include a plurality of shift registers. The buffer 242-1 may buffer and output the serial output data signal Sout output from the N-to-1 serializer 241-1. An output signal of the buffer 242-1 may be transmitted to the receiver.

The output signal storage circuit 243-1 may operate in synchronization with the serializer driving clock signal CLK_S_xN. The output signal storage circuit 243-1 may receive the serial output data signal Sout output from the N-to-1 serializer 241-1 in synchronization with the serializer driving clock signal CLK_S_xN. The serial output data signal Sout output from the N-to-1 serializer 241-1 may be stored in the output signal storage circuit 243-1. While the serial output data signal Sout is input in series to the output signal storage circuit 243-1, the data stored in the output signal storage circuit 243-1 may be output in parallel. The output signal storage circuit 243-1 may be realized using a shift register. The D-flip flop (DFF) 244-1 may operate in synchronization with the synchronization clock signal CLK_x1 output from the clock generator 110 and the data enablement signal DATA_EN output from the data readout pattern generator 122. The D-flip flop (DFF) 244-1 may synchronize the N-to-1 serializer 241-1 with the output signal storage circuit 243-1. Accordingly, the D-flip flop (DFF) 244-1 may apply its output signal to the output signal storage circuit 243-1 in synchronization with the synchronization clock signal CLK_x1 and the data enablement signal DATA_EN.

Figure 6:
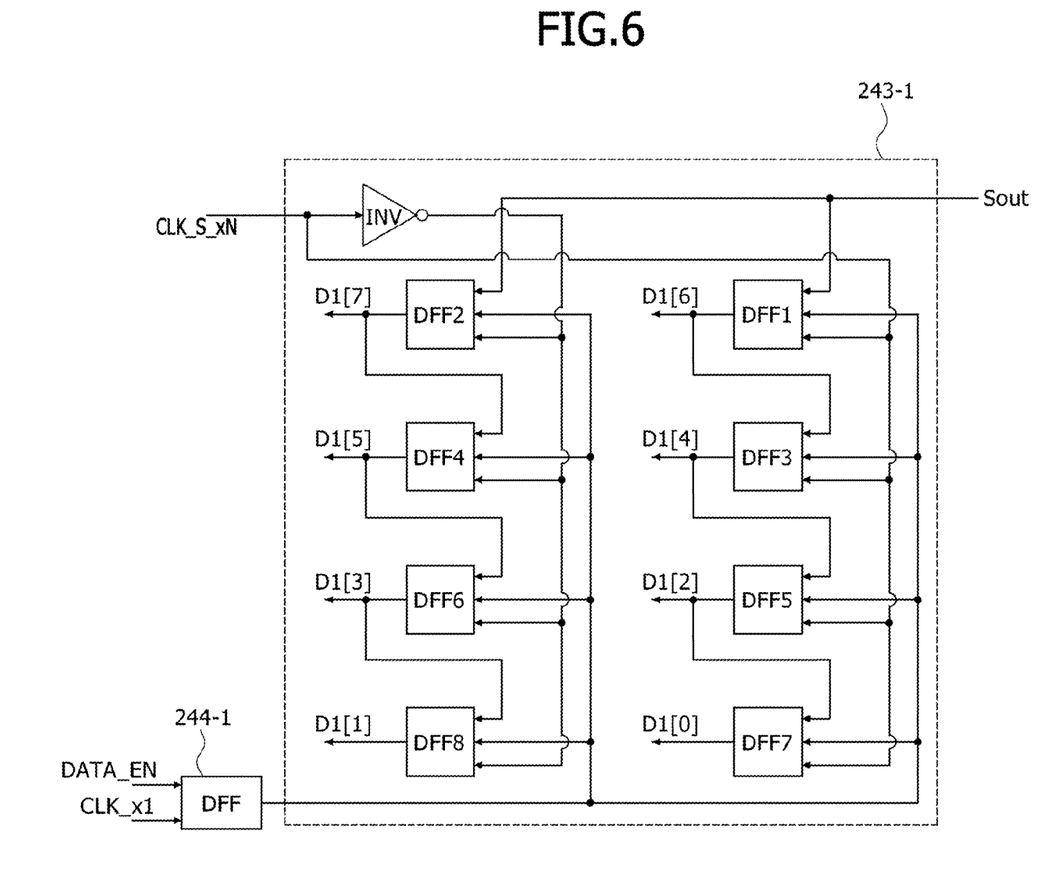
FIG. 6 is a diagram illustrating an example of each output signal storage circuit and a D-flip flop connected to the output signal storage circuit included in the data transmission system of FIG. 1.

FIG. 6 is a circuit diagram illustrating the output signal storage circuit 243-1 and the D-flip flop 244-1 included in the first data transmitter 140-1 of the data transmission system shown in FIG. 1. In FIG. 6, a configuration of the output signal storage circuit 243-1 is illustrated in conjunction with an example in which 8-bit data is stored. The output signal storage circuit 243-1 may include an inverter INV and a plurality of D-flip flops DFF1, DFF2, . . . , and DFF8. The inverter INV may receive and invert the serializer driving clock signal CLK_S_xN, and may output the inverted serializer driving clock signal. The number of the D-flip flops DFF1, DFF2, . . . , and DFF8 may be set to be equal to the number of bits included in each data stored in the output signal storage circuit 243-1.

The first, third, fifth, and seventh D-flip flops DFF1, DFF3, DFF5, and DFF7 may operate in synchronization with an output signal of the D-flip flop 244-1 and the serializer driving clock signal CLK_S_xN. For example, the first, third, fifth, and seventh D-flip flops DFF1, DFF3, DFF5, and DFF7 may operate in synchronization with a rising edge of the serializer driving clock signal CLK_S_xN. The first, third, fifth, and seventh D-flip flops DFF1, DFF3, DFF5, and DFF7 may be coupled in series so that an output signal of any one of the first, third, fifth, and seventh D-flip flops DFF1, DFF3, DFF5, and DFF7 is input to another one of the first, third, fifth, and seventh D-flip flops DFF1, DFF3, DFF5, and DFF7. The first D-flip flop DFF1 may receive the serial output data signal Sout output from the N-to-1 serializer (241-1 of FIG. 1), and an output signal OUT_D1 of the first D-flip flop DFF1 may be input to the third D-flip flop DFF3. An output signal OUT_D3 of the third D-flip flop DFF3 may be input to the fifth D-flip flop DFF5, and an output signal OUT_D5 of the fifth D-flip flop DFF5 may be input to the seventh D-flip flop DFF7.

An output signal OUT_D7 of the seventh D-flip flop DFF7 may constitute a first bit (D1<0> of FIG. 7) of the 8-bit parallel output data of the output signal storage circuit 243-1. The output signal OUT_D5 of the fifth D-flip flop DFF5 may constitute a third bit (D1<2> of FIG. 7) of the 8-bit parallel output data of the output signal storage circuit 243-1. The output signal OUT_D3 of the third D-flip flop DFF3 may constitute a fifth bit (D1<4> of FIG. 7) of the 8-bit parallel output data of the output signal storage circuit 243-1. The output signal OUT_D1 of the first D-flip flop DFF1 may constitute a seventh bit (D1<6> of FIG. 7) of the 8-bit parallel output data of the output signal storage circuit 243-1.

The second, fourth, sixth, and eighth D-flip flops DFF2, DFF4, DFF6, and DFF8 may operate in synchronization with an output signal of the D-flip flop 244-1 and an output signal of the inverter INV. Since the output signal of the inverter INV is an inverted signal of the serializer driving clock signal CLK_S_xN, the second, fourth, sixth, and eighth D-flip flops DFF2, DFF4, DFF6, and DFF8 may operate in synchronization with a falling edge of the serializer driving clock signal CLK_S_xN. Thus, the output signal storage circuit 243-1 including the first to eighth D-flip flops DFF1 to DFF8 may actually operate on a cycle corresponding to half a cycle of the serializer driving clock signal CLK_S_xN. The second, fourth, sixth, and eighth D-flip flops DFF2, DFF4, DFF6, and DFF8 may be coupled in series so that an output signal of any one of the second, fourth, sixth, and eighth D-flip flops DFF2, DFF4, DFF6, and DFF8 is input to another one of the second, fourth, sixth, and eighth D-flip flops DFF2, DFF4, DFF6, and DFF8. The second D-flip flop DFF2 may receive the serial output data signal Sout output from the N-to-1 serializer (241-1 of FIG. 1), and an output signal OUT_D2 of the second D-flip flop DFF2 may be input to the fourth D-flip flop DFF4. An output signal OUT_D4 of the fourth D-flip flop DFF4 may be input to the sixth D-flip flop DFF6, and an output signal OUT_D6 of the sixth D-flip flop DFF6 may be input to the eighth D-flip flop DFF8.

An output signal OUT_D8 of the eighth D-flip flop DFF8 may constitute a second bit (D1<1> of FIG. 7) of the 8-bit parallel output data of the output signal storage circuit 243-1. The output signal OUT_D6 of the sixth D-flip flop DFF6 may constitute a fourth bit (D1<3> of FIG. 7) of the 8-bit parallel output data of the output signal storage circuit 243-1. The output signal OUT_D4 of the fourth D-flip flop DFF4 may constitute a sixth bit (D1<5> of FIG. 7) of the 8-bit parallel output data of the output signal storage circuit 243-1. The output signal OUT_D2 of the second D-flip flop DFF2 may constitute an eighth bit (D1<7> of FIG. 7) of the 8-bit parallel output data of the output signal storage circuit 243-1.

Figure 7:
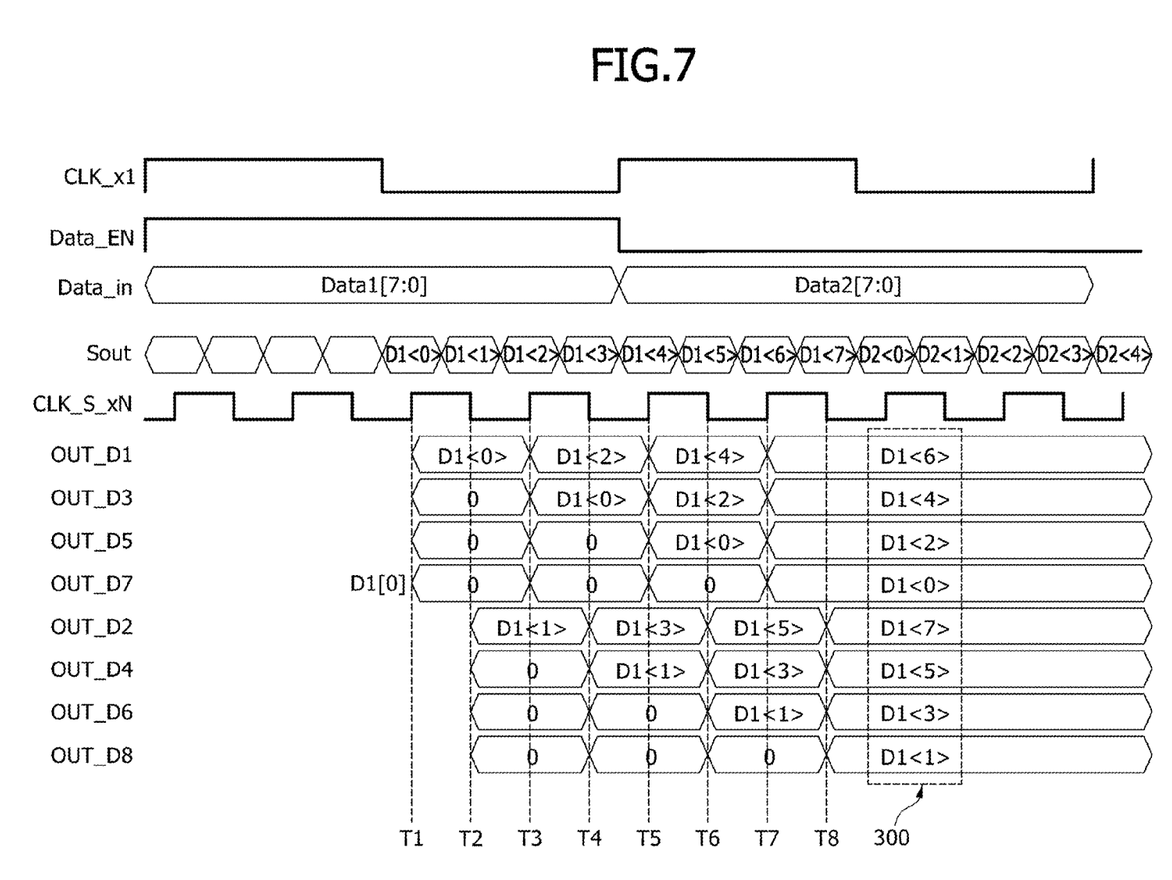
FIG. 7 is a timing diagram illustrating a method of testing data transmitted in a data transmission system according to an embodiment of the present disclosure.

FIG. 7 is a timing diagram illustrating a method of testing data transmission in a data transmission system according to an embodiment of the present disclosure. The method of testing the data transmission in the data transmission system will be described in conjunction with an example in which 8-bit data signals are transmitted through the first to $M^{th}$ transmission lanes. Referring to FIGS. 1, 2, 3, and 7, the synchronization clock signal CLK_x1 and the serializer driving clock signal CLK_S_xN output from the clock generator 110 may be input to each of the first to $M^{th}$ data transmitters 140-1, . . . , and 140-M. The synchronization clock signal CLK_x1 may be input to the N-to-1 serializers 241-1, . . . , and 241-M and the D-flip flops (DFF) 244-1, . . . , and 244-M included in the first to $M^{th}$ data transmitters 140-1 to 140-M. The serializer driving clock signal CLK_S_xN may be input to the N-to-1 serializers 241-1, . . . , and 241-M and the output signal storage circuits 243-1, . . . , and 243-M included in the first to $M^{th}$ data transmitters 140-1 to 140-M.

The first to $M^{th}$ N-bit data Din_1, . . . , and Din_M output from the data source 121 of the data generator 120 may be input to the first to $M^{th}$ data transmitters 140-1, . . . , and 140-M included in the first to $M^{th}$ transmission lanes, respectively. The first to $M^{th}$ N-bit data Din_1, . . . , and Din_M may have the same value, for example, the same logic level combination. The first to $M^{th}$ N-bit data Din_1, . . . , and Din_M may be input to the first to $M^{th}$ N-to-1 serializers 241-1, . . . , and 241-M of the first to $M^{th}$ data transmitters 140-1, . . . , and 140-M, respectively. The data enablement signal DATA_EN output from the data readout pattern generator 122 of the data generator 120 may be input to the first to $M^{th}$ data transmitters 140-1, . . . , and 140-M. The data enablement signal DATA_EN may be input to the D-flip flops (DFF) 244-1, . . . , and 244-M included in the first to $M^{th}$ data transmitters 140-1, . . . , and 140-M. If the data enablement signal DATA_EN is a high level signal, the first to $M^{th}$ N-bit data Din_1, . . . , and Din_M may be stored in the first to $M^{th}$ output signal storage circuits 243-1, . . . , and 243-M, respectively. In contrast, if the data enablement signal DATA_EN is a low level signal, the first to $M^{th}$ N-bit data Din_1, . . . , and Din_M may not be stored in the first to $M^{th}$ output signal storage circuits 243-1, . . . , and 243-M.

Since the first to $M^{th}$ data transmitters 140-1, . . . , and 140-M have the same function and perform the same operation, an operation of only the first data transmitter 140-1 included in the first transmission lane will be described hereinafter. The first N-to-1 serializer 241-1 may convert first input data DATA1<7:0> corresponding to the 8-bit parallel data Din_1 into first output data D1<0>, . . . , and D1<7> corresponding to the serial output data signal Sout. The first output data D1<0>, . . . , and D1<7> may be output from the first N-to-1 serializer 241-1 in synchronization with the serializer driving clock signal CLK_S_xN. Ideally, the first output data D1<0>, . . . , and D1<7> may be sequentially output in synchronization with rising edges and falling edges of the serializer driving clock signal CLK_S_xN. However, actually, the first output data D1<0>, . . . , and D1<7> may be sequentially output while the serializer driving clock signal CLK_S_xN is staying at a low level and at a high level because of a delay time of circuits in the data transmission system. The first output data D1<0>, . . . , and D1<7> may be output after a certain time period from a point in time when the first input data DATA1<7:0> are input. That is, the first output data D1<0>, . . . , and D1<7> may be output after output data corresponding to the previous 8-bit input data is output.

After the data bits of the first input data DATA1<7:0> are input in parallel, second input data DATA1<7:0> may be input in parallel to the first N-to-1 serializer 241-1. Thus, after the data bits of the first output data D1<0>, . . . , and D1<7> corresponding to the first input data DATA1<7:0> are output in series from the first N-to-1 serializer 241-1, data bits of second output data D2<0>, . . . , and D2<7> corresponding to the second input data DATA2<7:0> may be output in series from the first N-to-1 serializer 241-1. The data bits of the first and second output data D1<0>, . . . , D1<7>, D2<0>, . . . , and D2<7> output in series from the first N-to-1 serializer 241-1 may be sequentially transmitted to the receiver through the buffer 242-1.

While the data bits of the first input data DATA1<7:0> are being input in parallel, the data enablement signal DATA_EN may have a high level. Thus, the first output data D1<0>, . . . , and D1<7> corresponding to the first input data DATA1<7:0> may be sequentially input to the first output signal storage circuit 243-1. The first output data D1<0>, . . . , and D1<7> sequentially input to the first output signal storage circuit 243-1 may be shifted by the D-flip flops in the first output signal storage circuit 243-1. Specifically, the first and second bits D1<0> and D2<1> of the first output data D1<0>, . . . , and D1<7> may be input to the first D-flip flop DFF1 and the second D-flip flop DFF2 of the first output signal storage circuit 243-1, respectively. Since the first D-flip flop DFF1 operates in synchronization with the serializer driving clock signal CLK_S_xN, the first D-flip flop DFF1 may output the first bit D1<0> as the output signal OUT_D1 in synchronization with a rising edge (a point in time "T1") of the serializer driving clock signal CLK_S_xN. In contrast, since the second D-flip flop DFF2 operates in synchronization with an inverted signal of the serializer driving clock signal CLK_S_xN, the second D-flip flop DFF2 may output the second bit D1<1> as the output signal OUT_D2 in synchronization with a falling edge (a point in time "T2") of the serializer driving clock signal CLK_S_xN.

At a point in time corresponding to the next rising edge (a point in time "T3") of the serializer driving clock signal CLK_S_xN, the first bit D1<0> corresponding to the output signal OUT_D1 of the first D-flip flop DFF1 may be shifted to the third D-flip flop DFF3 to provide the output signal OUT_D3 of the third D-flip flop DFF3, and the third bit D1<2> of the first output data D1<0>, . . . , and D1<7> may be output as the output signal OUT_D1 of the first D-flip flop DFF1. At a point in time corresponding to the next falling edge (a point in time "T4") of the serializer driving clock signal CLK_S_xN, the second bit D1<1> corresponding to the output signal OUT_D2 of the second D-flip flop DFF2 may be shifted to the fourth D-flip flop DFF4 to provide the output signal OUT_D4 of the fourth D-flip flop DFF4, and the fourth bit D1<3> of the first output data D1<0>, . . . , and D1<7> may be output as the output signal OUT_D2 of the second D-flip flop DFF2.

At a point in time corresponding to a next rising edge (a point in time "T5") of the serializer driving clock signal CLK_S_xN, the third bit D1<2> corresponding to the output signal OUT_D1 of the first D-flip flop DFF1 may be shifted to the third D-flip flop DFF3 to provide the output signal OUT_D3 of the third D-flip flop DFF3, and the first bit D1<0> corresponding to the output signal OUT_D3 of the third D-flip flop DFF3 may be shifted to the fifth D-flip flop DFF5 to provide the output signal OUT_D5 of the fifth D-flip flop DFF5. In addition, the fifth bit D1<4> of the first output data D1<0>, . . . , and D1<7> may be output as the output signal OUT_D1 of the first D-flip flop DFF1.

At a point in time corresponding to the next falling edge (a point in time "T6") of the serializer driving clock signal CLK_S_xN, the fourth bit D1<3> corresponding to the output signal OUT_D2 of the second D-flip flop DFF2 may be shifted to the fourth D-flip flop DFF4 to provide the output signal OUT_D4 of the fourth D-flip flop DFF4, and the second bit D1<1> corresponding to the output signal OUT_D4 of the fourth D-flip flop DFF4 may be shifted to the sixth D-flip flop DFF6 to provide the output signal OUT_D6 of the sixth D-flip flop DFF6. In addition, the sixth bit D1<5> of the first output data D1<0>, . . . , and D1<7> may be output as the output signal OUT_D2 of the second D-flip flop DFF2.

At a point in time corresponding to the next rising edge (a point in time "T7") of the serializer driving clock signal CLK_S_xN, the fifth bit D1<4> corresponding to the output signal OUT_D1 of the first D-flip flop DFF1 may be shifted to the third D-flip flop DFF3 to provide the output signal OUT_D3 of the third D-flip flop DFF3, and the third bit D1<2> corresponding to the output signal OUT_D3 of the third D-flip flop DFF3 may be shifted to the fifth D-flip flop DFF5 to provide the output signal OUT_D5 of the fifth D-flip flop DFF5. In addition, the first bit D1<0> corresponding to the output signal OUT_D5 of the fifth D-flip flop DFF5 may be shifted to the seventh D-flip flop DFF7 to provide the output signal OUT_D7 of the seventh D-flip flop DFF7. Moreover, the seventh bit D1<6> of the first output data D1<0>, . . . , and D1<7> may be output as the output signal OUT_D1 of the first D-flip flop DFF1.

At a point in time corresponding to the next falling edge (a point in time "T8") of the serializer driving clock signal CLK_S_xN, the sixth bit D1<5> corresponding to the output signal OUT_D2 of the second D-flip flop DFF2 may be shifted to the fourth D-flip flop DFF4 to provide the output signal OUT_D4 of the fourth D-flip flop DFF4, and the fourth bit D1<3> corresponding to the output signal OUT_D4 of the fourth D-flip flop DFF4 may be shifted to the sixth D-flip flop DFF6 to provide the output signal OUT_D6 of the sixth D-flip flop DFF6. In addition, the second bit D1<1> corresponding to the output signal OUT_D6 of the sixth D-flip flop DFF6 may be shifted to the eighth D-flip flop DFF8 to provide the output signal OUT_D8 of the eighth D-flip flop DFF8. Moreover, the eighth bit D1<7> of the first output data D1<0>, . . . , and D1<7> may be output as the output signal OUT_D2 of the second D-flip flop DFF2.

As described above, the first output signal storage circuit 243-1 may receive the first output data D1<0>, . . . , and D1<7> output in series from the N-to-1 serializer 241-1 during a certain period and the first output data D1<0>, . . . , and D1<7> may be output in parallel from the first to eighth D-flip flops DFF1 to DFF8 constituting the first output signal storage circuit 243-1 at a certain point in time (e.g., a portion indicated by a reference numeral '300' of FIG. 7). The first output data D1<0>, . . . , and D1<7> output in parallel from the first output signal storage circuit 243-1 may constitute the first output data Dout_1, and may be input to the comparison circuit 130. The comparison circuit 130 may compare the first to $M^{th}$ output data Dout_1, . . . , and Dout_M transmitted through the first to $M^{th}$ transmission lanes to determine whether the first to $M^{th}$ output data Dout_1, . . . , and Dout_M have the same logic level combination or not, as described with reference to FIGS. 4 and 5. The comparison circuit 130 may output an error flag signal whose level is determined according to the determination result to indicate whether data distortion has occurred or not.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A data transmission system including a plurality of data transmitters respectively constituting a plurality of transmission lanes, wherein each of the plurality of data transmitters comprising:
    a serializer configured to covert parallel input data into serial output data and configured to output the serial output data;
    an output signal storage circuit configured to store the serial output data output from the serializer;
    a data readout pattern generator configured to generate, during a test operation, a data enablement signal and parallel data for test purposes; and
    a data source configured to generate, during a normal operation, parallel data desired to be transmitted,
    wherein the data readout pattern generator and the data source constitutes a data generator, and
    wherein the output signal storage circuit stores the serial output data output from the serializer while the data enablement signal is a high level signal.

2. The data transmission system of claim 1, wherein each of the data transmitters further includes a D-flip flop applying an output signal thereof to the first D-flip flop, the second D-flip flop, the first group of D-flip flops and the second group of D-flip flops in synchronization with the synchronization clock signal and the data enablement signal.

3. The data transmission system of claim 2, wherein output signals of the first D-flip flop, the second D-flip flop, the first group of D-flip flops and the second group of D-flip flops are output in synchronization with an output signal of the D-flip flop.

4. The data transmission system of claim 3, further comprising a comparison circuit configured to receive and compare output signals of the output signal storage circuits included in the plurality of data transmitters.

5. The data transmission system of claim 4, wherein the comparison circuit includes:
    a shift register configured to store and shift output data of the plurality of data transmitters; and
    a comparator configured to compare the output data of the plurality of data transmitters.

6. The data transmission system of claim 5, wherein the comparator includes a plurality of comparison logic circuits and an OR gate executing an OR operation on output signals of the plurality of comparison logic circuits, and the plurality of comparison logic circuits compare logic level combinations of the output data of the plurality of data transmitters.

7. The data transmission system of claim 6, wherein output data of the shift register included in the comparison circuit includes first to $M^{th}$ output data (where "M" is a natural number equal to or greater than two), each of the first to $M^{th}$ output data having first to $N^{th}$ bit data (where "N" is a natural number which is equal to or greater than two), and wherein each of the plurality of comparison logic circuits includes:
    a plurality of exclusive OR gates comparing one bit of the first to $N^{th}$ bits of the first output data in a certain order bit position with bits of the second to $M^{th}$ output data in the same order bit positions as the one bit of the first output data; and
    an OR gate executing an OR operation on output signals of the plurality of exclusive OR gates.

8. The data transmission system of claim 1, further comprising a clock generator configured to generate a synchronization clock signal, a serializer driving clock signal, and a test read clock signal,
    wherein the serializer and the output signal storage circuit are operated in synchronization with the serializer driving clock signal.

9. The data transmission system of claim 8, wherein the output signal storage circuit is realized using a shift register.

10. The data transmission system of claim 9, wherein the shift register includes:
    a first D-flip flop and a second D-flip flop configured to receive the serial output data output from the serializer;
    a first group of D-flip flops configured to sequentially shift and output an output signal of the first D-flip flop; and
    a second group of D-flip flops configured to sequentially shift and output an output signal of the second D-flip flop.

11. The data transmission system of claim 10, wherein the shift register further includes an inverter that inverts the serializer driving clock signal output from the clock generator and outputs the inverted signal of the serializer driving clock signal.

12. The data transmission system of claim 11, wherein the first D-flop flip and the first group of D-flip flops operate in synchronization with the serializer driving clock signal, and the second D-flop flip and the second group of D-flip flops operate in synchronization with an output signal of the inverter.

* * * * *